US009980068B2

(12) United States Patent
Berthelsen et al.

(10) Patent No.: US 9,980,068 B2
(45) Date of Patent: May 22, 2018

(54) METHOD OF ESTIMATING DIAPHRAGM EXCURSION OF A LOUDSPEAKER

(71) Applicant: Analog Devices Global, Hamilton (BM)

(72) Inventors: Kim Spetzler Berthelsen, Koge (DK); Kasper Strange, Kobenhavn O (DK)

(73) Assignee: Analog Devices Global, Hamilton (BM)

( * ) Notice: Subject to any disclaimer, the term of this patent is extended or adjusted under 35 U.S.C. 154(b) by 666 days.

(21) Appl. No.: 14/073,324

(22) Filed: Nov. 6, 2013

(65) Prior Publication Data

US 2015/0124982 A1     May 7, 2015

(51) Int. Cl.
*H04R 29/00* (2006.01)
*H03F 1/52* (2006.01)
(Continued)

(52) U.S. Cl.
CPC ............. *H04R 29/001* (2013.01); *H03F 1/52* (2013.01); *H03F 2200/462* (2013.01);
(Continued)

(58) Field of Classification Search
CPC ......... H03F 2200/471; H03F 2200/462; H03F 1/52; H03G 11/04; H03G 7/08;
(Continued)

(56) References Cited

U.S. PATENT DOCUMENTS 3,875,341 A     4/1975 Gassmann 4,541,109 A     9/1985 Shimizu et al.
(Continued)

FOREIGN PATENT DOCUMENTS

CN          1998262 A       7/2007
CN        102158793 A       8/2011
(Continued)

OTHER PUBLICATIONS

Clark, Precision Measurement of loudspeaker parameters, AES, 1997.*
(Continued)

*Primary Examiner* — Davetta W Goins
*Assistant Examiner* — Kuassi Ganmavo
(74) *Attorney, Agent, or Firm* — Schwegman Lundberg & Woessner, P.A.

(57) ABSTRACT

A method of estimating diaphragm excursion of an electrodynamic loudspeaker may be performed using audio signals. An audio output signal may be applied to a voice coil of the electrodynamic loudspeaker through an output amplifier to produce sound. A detected voice coil current and a determined voice coil voltage may be applied to a linear adaptive digital loudspeaker model that has a plurality of adaptive loudspeaker parameters. The parameter values of the adaptive loudspeaker parameters may be computed based on the linear adaptive digital loudspeaker model and applied to a non-linear state-space model of the electrodynamic loudspeaker. For the non-linear state-space model, a predetermined non-linear function may be applied to at least one of the plurality of received parameter values to compute at least one non-linearity compensated parameter value of the adaptive loudspeaker parameters, to determine an instantaneous excursion of the diaphragm.

30 Claims, 8 Drawing Sheets

(51) Int. Cl.
*H03G 11/04* (2006.01)
*H03G 9/00* (2006.01)
*H04R 3/00* (2006.01)
*H04R 1/00* (2006.01)
*H03G 7/08* (2006.01)

(52) U.S. Cl.
CPC ......... *H03F 2200/471* (2013.01); *H03G 7/08* (2013.01); *H03G 9/005* (2013.01); *H03G 11/04* (2013.01); *H04R 1/00* (2013.01); *H04R 3/002* (2013.01); *H04R 3/007* (2013.01); *H04R 29/00* (2013.01); *H04R 29/003* (2013.01)

(58) Field of Classification Search
CPC ........ H03G 9/025; H03G 9/005; H04R 3/002; H04R 1/00; H04R 3/007; H04R 29/003; H04R 29/001
USPC ...... 381/55, 56, 83, 103, 98, 61, 66, 91, 95, 381/96, 122
See application file for complete search history.

(56) References Cited

U.S. PATENT DOCUMENTS

| | | | |
|---|---|---|---|
| 5,031,221 | A | 7/1991 | Yokoyama |
| 5,548,650 | A | 8/1996 | Clark |
| 5,613,218 | A | 3/1997 | Li et al. |
| 5,931,221 | A | 8/1999 | Inoue et al. |
| 7,034,731 | B2* | 4/2006 | Uramoto et al. ............. 341/143 |
| 7,107,159 | B2 | 9/2006 | German |
| 7,298,296 | B1 | 11/2007 | Kamath |
| 7,372,966 | B2 | 5/2008 | Bright |
| 7,716,808 | B2 | 5/2010 | Hutt et al. |
| 7,826,625 | B2* | 11/2010 | Lashkari ................. H04R 3/04 381/103 |
| 8,538,039 | B2 | 9/2013 | Pfaffinger |
| 8,712,065 | B2* | 4/2014 | Solgaard et al. ............... 381/55 |
| 2003/0021427 | A1 | 1/2003 | Nakada et al. |
| 2003/0142832 | A1* | 7/2003 | Meerkoetter ........ H04R 29/003 381/59 |
| 2004/0178852 | A1* | 9/2004 | Neunaber ..................... 330/284 |
| 2006/0133620 | A1 | 6/2006 | Lashkari |
| 2006/0172716 | A1 | 8/2006 | Yoshii et al. |
| 2007/0041606 | A1 | 2/2007 | Sheppard |
| 2007/0140058 | A1 | 6/2007 | Mcintosh et al. |
| 2009/0058549 | A1 | 3/2009 | Kost |
| 2009/0098714 | A1 | 4/2009 | Chang et al. |
| 2009/0268918 | A1* | 10/2009 | Solgaard et al. ............... 381/55 |
| 2011/0258489 | A1 | 10/2011 | Nielsen |
| 2012/0121098 | A1* | 5/2012 | Gautama ................ H04R 3/007 381/59 |
| 2012/0195443 | A1 | 8/2012 | Kim et al. |
| 2012/0249125 | A1 | 10/2012 | Yamkovoy et al. |
| 2012/0281844 | A1* | 11/2012 | Luo ........................... H03F 1/52 381/55 |
| 2012/0308046 | A1 | 12/2012 | Muza |
| 2013/0077795 | A1* | 3/2013 | Risbo et al. ..................... 381/55 |
| 2013/0170660 | A1 | 7/2013 | Kristensen et al. |
| 2013/0259295 | A1* | 10/2013 | Pometun et al. ............ 382/100 |
| 2014/0254805 | A1* | 9/2014 | Su et al. ......................... 381/55 |
| 2015/0304772 | A1* | 10/2015 | Risberg ................. H04R 3/002 381/55 |
| 2017/0006394 | A1* | 1/2017 | Risberg ................. H04R 3/002 |

FOREIGN PATENT DOCUMENTS

| | | |
|---|---|---|
| CN | 102469382 A | 5/2012 |
| CN | 103037299 A | 4/2013 |
| CN | 103327437 A | 9/2013 |
| CN | 104640051 A | 5/2015 |
| DE | 19804992 C1 | 8/1999 |
| DE | 102014115719 A1 | 5/2015 |
| EP | 2453670 A1 | 5/2012 |
| EP | 2498511 A1 | 9/2012 |
| EP | 2538699 A1 | 12/2012 |
| JP | 2005175751 A | 6/2005 |
| WO | 97/03536 A1 | 1/1997 |
| WO | WO-0145459 A2 | 6/2001 |
| WO | WO-2011079875 A1 | 7/2011 |

OTHER PUBLICATIONS

Anderson, Derivation of Moving Coil loudspeaker parameters using plane wave tube technique, BYU 2004.*
Klippel, Modeling load induced aging of loudspeaker suspension, HAL 2012.*
Sorio Rodriguez et al, Modeling and real time auralization of electrodynamic loudspeaker non-linearities, IEEE, 2004.*
Jan et al, Identification of loudspeaker nonlinearities using the NARNAX modeling technique, AES, 2001.*
Bai et al, Expert Diagnostic system for moving coil loudspeakers using non linear modeling, ASA, 2009.*
Oyen, Compensation of Loudspeaker Nonlinearities, Jul. 2007.*
Mihelich, Loudspeaker Nonlinear Parameter estimation an optimization Method, AEs, 2001.*
Pedersen, A study of Loudspeaker Design supported by Digital Signal Processing, PhD, May 2008.*
Pawar, Experimental Verifications and Simulations of Magnetic Motor of circular miniature loudspekaer for total harmonic distortion improvement, 2011.*
Dobrucki, Nonlinear Distortions in electroacoustics Devices, 2011.*
Bai et al, Expert diagnostic System for moving coil loudspeaker using nonlinear modeling, JAMA,2009.*
Klippel, Adaptive Non linear control of Loudspeaker Systems, AES,1998.*
Clark et al., "Modeling and Controlling Excursion-Related Distortion in Loudspeakers", 106th AES Convention, May 1999, pp. 4862.
Klippel, "Active Reduction of Nonlinear Loudspeaker Distortion", Active 99 Conference, Dec. 1999, pp. 1135.
Luo et al., "A Model Based Excursion Protection Algorithm for Loudspeakers", IEEE International Conference on Acoustics, Speech and Signal Processing (ICASSP), Mar. 2012, pp. 233.
Clark, "Amplitude Modulation Method for Measuring Linear Excursion of Loudspeakers", Audio Engineering Society Convention Papers, AES Convention 89, Sep. 1990, 18 pages.
Dodd et al., "Voice Coil Impedance as a Function of Frequency and Displacement", Audio Engineering Society Convention Papers, AES Convention 117, Oct. 2004, 17 pages.
Klippel, "Assessment of Voice-Coil Peak Displacement Xmax", Journal of the Audio Engineering Society, vol. 51, No. 5, May 2003, pp. 307-323.
Klippel, "Loudspeaker Nonlinearities—Causes, Parameters, Symptoms", Audio Engineering Society Convention Papers, AES Convention 119, Oct. 2005, 69 pages.
Klippel, "Tutorial: Loudspeaker Nonlinearities—Causes, Parameters, Symptoms", Journal of the Audio Engineering Society, vol. 54, No. 10, Oct. 2006, pp. 907-939.
Thorborg et al., "An Improved Electrical Equivalent Circuit Model for Dynamic Moving Coil Transducers", Audio Engineering Society Convention Papers, AES Convention 122, May 2007, 13 pages.
Extended European Search Report dated Jul. 22, 2014, in European application No. 14156524.2, 11 pages.
"Chinese Application Serial No. 201410616081.8, Office Action dated Jul. 10, 2017", 13 pgs.

* cited by examiner

A)

B)

METHOD OF ESTIMATING DIAPHRAGM EXCURSION OF A LOUDSPEAKER

The present invention relates to a method of estimating diaphragm excursion of an electrodynamic loudspeaker comprising steps of receiving an audio input signal and generating an audio output signal based thereon. The method comprises steps of applying the audio output signal to a voice coil of the electrodynamic loudspeaker through an output amplifier to produce sound, applying a detected voice coil current and a determined voice coil voltage to a linear adaptive digital loudspeaker model comprising a plurality of adaptive loudspeaker parameters. The method comprises further steps of computing a plurality of parameter values of the plurality of respective adaptive loudspeaker parameters based on the linear adaptive digital loudspeaker model and applying the plurality of parameter values to a non-linear state-space model of the electrodynamic loudspeaker. A step of applying, in the non-linear state-space model, a predetermined non-linear function representing a non-linear relationship between a loudspeaker parameter and a predetermined loudspeaker variable to at least one of the plurality of received parameter values computes at least one non-linearity compensated parameter value of at least one adaptive loudspeaker parameter. The non-linearity compensated parameter value and the audio input signal are applied to a non-linear state-space model of the electrodynamic loudspeaker and an instantaneous excursion of the diaphragm is determined based on the audio input signal and the non-linear state-space model of the electrodynamic loudspeaker.

BACKGROUND OF THE INVENTION

The present invention relates to a method of estimating diaphragm excursion of an electrodynamic loudspeaker. The electrodynamic loudspeaker may for example be mounted in a substantially acoustic sealed enclosure or ventilated enclosure of a portable communication device. The electrodynamic loudspeaker may be utilized for sound reproduction purposes, e.g. as a receiver for producing sound by acoustic coupling to the user's ear, or as a loudspeaker for playing recorded music or for voice reproduction in teleconferencing applications.

It is of significant interest to accurately estimate diaphragm excursion or displacement of an electrodynamic loudspeaker in a numerous sound reproduction applications and devices for the purpose of protecting the electrodynamic loudspeaker against mechanical damage. The diaphragm excursion must be accurately estimated to allow for a correspondingly accurate control of the diaphragm excursion. The accurate control or limiting of the diaphragm excursion is important to avoid the diaphragm or diaphragm assembly is driven above its maximum excursion limit which may happen if the diaphragm excursion is underestimated. If the maximum excursion limit is exceeded, various kinds to transitory or permanent mechanical damage may be imparted to the loudspeaker leaving the latter temporarily or permanently inoperative. The mechanical damage may be caused by collision between movable loudspeaker components, such as the voice coil, diaphragm or voice coil bobbin, and a stationary component of the loudspeaker such as the magnetic circuit. On the other hand, if the diaphragm excursion is overestimated and the excursion limitation therefore activated at an instantaneous excursion well below the maximum excursion limit of the loudspeaker in question, the maximum sound pressure of the loudspeaker is unduly restricted.

Since electrodynamic loudspeakers generally are rather non-linear devices, in particular at high sound pressure levels, with a large number of complex non-linearities it has proved difficult to accurately estimate the diaphragm excursion by various kinds of predictive model based approaches. In addition, parameter values of linear loudspeaker parameters of the electrodynamic loudspeaker, such as mechanical compliance and voice coil resistance, also vary slowly but markedly over time and temperature which leads to further challenges in maintaining an accurate model of the electrodynamic loudspeaker.

Hence, it is of significant interest and value to provide a relatively simple methodology for accurately estimating diaphragm excursion of the electrodynamic loudspeaker taking into account both the non-linear property of one or more loudspeaker parameters and the slowly time-varying property of the loudspeaker parameters. It would be advantageous compensate for the non-linear property of the one or more loudspeaker parameters without requiring time-consuming and costly individual characterization of the non-linearity of the electrodynamic loudspeaker during manufacturing of equipment or devices including the electrodynamic loudspeaker. The methodology of estimating the diaphragm excursion should preferably avoid complex computations to minimize the expenditure of computational resources of a signal processor implementing certain steps of the diaphragm excursion estimation methodology.

SUMMARY OF THE INVENTION

A first aspect of the invention relates to a method of estimating diaphragm excursion of an electrodynamic loudspeaker comprising steps of:
 receiving an audio input signal and generating an audio output signal based thereon,
 applying the audio output signal to a voice coil of the electrodynamic loudspeaker through an output amplifier to produce sound,
 determining a voice coil voltage across the voice coil,
 detecting a voice coil current in response to the voice coil voltage,
 applying the detected voice coil current and the determined voice coil voltage to a linear adaptive digital loudspeaker model comprising a plurality of adaptive loudspeaker parameters,
 computing a plurality of parameter values of the plurality of respective adaptive loudspeaker parameters based on the linear adaptive digital loudspeaker model,
 applying the plurality of parameter values to a non-linear state-space model of the electrodynamic loudspeaker,
 applying, in the non-linear state-space model, a predetermined non-linear function representing a non-linear relationship between a loudspeaker parameter and a predetermined loudspeaker variable to at least one of the plurality of received parameter values to compute at least one non-linearity compensated parameter value of at least one adaptive loudspeaker parameter,
 applying the audio input signal to the non-linear state-space model of the electrodynamic loudspeaker,
 determining an instantaneous excursion of the diaphragm based on the audio input signal and the non-linear state-space model of the electrodynamic loudspeaker.

The use of the predetermined non-linear function which represents the non-linear relationship between the loudspeaker parameter and the predetermined loudspeaker variable in the non-linear state-space model improves the accuracy of the diaphragm excursion estimate. Hence, the present methodology allows accurate control or limitation of the instantaneous diaphragm excursion circumventing the previously discussed problems associated with underestimating and overestimating the diaphragm excursion.

The skilled person will understand that the predetermined non-linear function may form an integral portion of the non-linear state-space model of the electrodynamic loudspeaker or the non-linear function may be computed in a separate pre-processing block or step before application to a linear state-space model of the loudspeaker. In the first embodiment, the predetermined non-linear function may be expressed as non-linear equation(s) of the non-linear state-space model. In the second embodiment, the predetermined non-linear function may be applied to the at least one adaptive loudspeaker parameter together with an instantaneous diaphragm displacement signal in the separate pre-processing block or step to compute the value of the at least one non-linearity compensated parameter value. The at least one non-linearity compensated parameter value may subsequently be inputted to a linear state-space model of the electrodynamic loudspeaker as explained in additional detail below with reference to the appended drawings. The latter embodiment reduces the computational load associated with the computation of the non-linear state-space model.

The detection of the voice coil voltage may be accomplished by a direct measurement e.g. by an A/D converter coupled to the voice coil voltage or by indirect determination where the voice coil voltage is determined or estimated from a known level of the audio signal, e.g. digitally represented, and a known DC supply voltage of the output amplifier.

The audio output signal applied to the loudspeaker during normal operation may comprise speech and/or music supplied from a suitable audio source such as radio, CD player, network player, MP3 player. The audio source may also comprise a microphone generating a real-time microphone signal in response to incoming sound. The skilled person will appreciate that each of the audio signal, the voice coil voltage, and the voice coil current may be represented by an analog signal for example as a voltage, current, charge etc. or alternatively be represented by a digital signal, e.g. a sampled signal that is coded in binary format at a suitable sampling frequency or rate and resolution. The output amplifier preferably comprises a switching or class D amplifier for example a Pulse Density Modulation (PDM) or Pulse Width Modulation (PWM) output amplifier which both possess high power conversion efficiency. This is a particularly advantageous feature for use in battery powered portable communication devices. In the alternative, the output amplifier may comprise traditional non-switched power amplifier topologies like class A or class AB.

The present diaphragm excursion methodology may be applied to a wide range of electrodynamic loudspeakers in various applications such as low-frequency or broad-band loudspeakers for High Fidelity applications, automotive or Public Address applications as well as to miniature electrodynamic loudspeakers for portable communication devices and/or music players. In the latter case, the electrodynamic loudspeaker may be integrated in a mobile phones or smartphone and mounted in a sealed or ventilated enclosure with a volume between 0.5 and 2.0 $cm^3$ such as about 1 $cm^3$.

According to one advantageous embodiment of the present methodology of estimating diaphragm excursion, the predetermined non-linear function represents an average non-linear relationship between the at least one loudspeaker parameter and the predetermined loudspeaker variable determined by non-linear relationship measurements on a plurality of representative electrodynamic loudspeakers. The present inventors have recognized that the non-linear relationship between the at least one loudspeaker parameter and the predetermined loudspeaker variable is a relatively well-defined and time invariant relationship despite the pronounced variation over time and temperature of the respective parameter values of the plurality of linear or small-signal loudspeaker parameters and the large sample-to-sample variations of the respective parameter values of the plurality of linear loudspeaker parameters. Consequently, by adapting the respective parameter values of the plurality of linear or small-signal loudspeaker parameters of the linear adaptive digital loudspeaker model, these parameter variations are tracked over time and temperature. Furthermore, by applying the predetermined non-linear function to a current parameter value of the at least one adaptive loudspeaker parameter, the non-linear contribution to the diaphragm excursion of the electrodynamic loudspeaker is calculated from an accurate linear model of the electrodynamic loudspeaker. Following this methodology, the least one non-linearity compensated parameter value may be computed as a relative adjustment of the current parameter value in accordance with the predetermined non-linear function.

Various loudspeaker variables may be selected as the predetermined loudspeaker variable of the predetermined non-linear function in view of the large number of complex non-linearities of electrodynamic loudspeakers. Naturally, the predetermined loudspeaker variable preferably comprises a variable which makes a significant contribution to the non-linear behaviour of the loudspeaker parameter in question. Hence, the predetermined loudspeaker variable preferably comprises the diaphragm excursion or displacement such that the predetermined non-linear function represents an excursion dependent non-linear property of the electrodynamic loudspeaker because the displacement of the diaphragm typically plays a significant role in the non-linear behaviour of loudspeaker parameters such as force factor (B*I or BI product), total mechanical compliance or stiffness, voice coil inductance etc. Alternatively, or additionally, the predetermined loudspeaker variable may comprise a voice coil current since to this variable also is the source of significant non-linearity of certain loudspeaker parameters such as the force factor.

Hence, according to one preferred embodiment of the present method of estimating diaphragm excursion the plurality of adaptive loudspeaker parameters comprises a force factor (B*I) and the predetermined non-linear function represents a measured excursion dependence of the force factor (B*I) so as to include a non-linearity compensated force factor value in the non-linear state space model of the electrodynamic loudspeaker.

According to another embodiment, the plurality of adaptive loudspeaker parameters comprises a total mechanical compliance or stiffness of the diaphragm and the predetermined non-linear function represents a measured excursion dependence of the total mechanical compliance or stiffness so as to provide a non-linearity compensated diaphragm suspension compliance or stiffness in the non-linear state space model of the electrodynamic loudspeaker. The skilled person will appreciate that the plurality of adaptive loudspeaker parameters may comprise both the force factor and the total mechanical compliance or stiffness represented by respective predetermined non-linear functions representing their respective measured excursion dependencies.

The skilled person will understand that the present methodology may use a plurality predetermined non-linear functions, each one representing a particular non-linear relationship between a particular loudspeaker parameter of the plurality of adaptive loudspeaker parameters and a particular predetermined loudspeaker variable, to compute a plurality of non-linearity compensated parameter values of the respective adaptive loudspeaker parameters. Representing a large number of adaptive loudspeaker parameters by respective non-linear functions will generally improve the accuracy of computed loudspeaker parameter values in the non-linear state-space model and thus improve accuracy of the diaphragm excursion estimate. However, this improved accuracy may be reached at the cost of increased computational load. Consequently, the number of non-linear functions applied in the non-linear state-space model may advantageously be adapted to the application relevant requirements for accuracy of the excursion prediction or estimation.

The linear adaptive digital loudspeaker model preferably comprises an adaptive IIR filter of second order, or of higher order, comprising a plurality of adaptable model parameters from which the plurality of parameter values of the plurality of adaptive loudspeaker parameters are derived. The adaptive IIR filter models or tracks a time varying and frequency dependent impedance of the loudspeaker across a predetermined audio frequency range, for example between 10 Hz and 10 kHz. The detected voice coil current and detected voice coil voltage are preferably represented by a digital voice coil current signal and a digital voice coil voltage, respectively, as explained in additional detail below with reference to the appended drawings. To assist proper adaptation of the linear adaptive digital loudspeaker model the latter preferably comprises at least one fixed loudspeaker parameter such as a total moving mass of the loudspeaker in addition to the one or more adaptable or free model parameters A preferred embodiment of the present methodology of estimating diaphragm excursion comprises a further step of controlling or limiting the diaphragm excursion if the instantaneous diaphragm excursion exceeds a certain excursion limit. This embodiment comprises steps of:
    comparing an instantaneous diaphragm excursion with a predetermined limit criterion and limiting excursion of the diaphragm in accordance with a result of the comparison.

The predetermined limit criterion may for example define a maximum diaphragm excursion or displacement for example one that is recommend by the loudspeaker manufacturer to avoid mechanical damage to the speaker. The step of limiting the diaphragm excursion may for example comprise a step of attenuating a level of the audio signal in a sub-band of the audio signal or broad-band attenuating the audio signal. The attenuation of the audio signal level may be accomplished by attenuating a level of the audio output signal across the voice coil or attenuating the voice coil current. The sub-band is preferably as a low-frequency band of the audio signal for example a frequency band below 800 Hz or 500 Hz. This is often very effective for mechanical protection purposes because low-frequency audio signal components are most likely to drive the loudspeaker diaphragm outside its maximum excursion limit. The low-frequency band may comprise all frequencies below a certain threshold frequency such as 800 Hz or 500 Hz or only an isolated frequency band such as one-third octave band centred at a selected frequency within the low-frequency band, e.g. 400 Hz or 300 Hz etc.

Yet another embodiment of the method comprises a step of, prior to the comparison step between the instantaneous diaphragm excursion and the predetermined limit criterion, delaying the audio input signal with a predetermined delay time such as a delay time less than 8 ms or more preferably a delay time less than 4 ms.

The method of estimating diaphragm excursion may comprise steps of:
    comparing the audio input signal with one of a predetermined level criterion and a predetermined spectral criterion,
    interrupting adaptation of the plurality of adaptive loudspeaker parameters of the linear adaptive digital loudspeaker model based on a result of the comparison.

This embodiment is helpful to ensure that adaptation of the plurality of adaptive loudspeaker parameters is interrupted if the digital audio input signal is a substantially pure tone, or other narrow band audio signal, which tends to derail adaptive filter algorithms such as Least Mean Squares. The latter type of adaptive filter algorithm may be applied by the adaptive linear digital loudspeaker model The voice coil voltage and the voice coil current are preferably represented in digital formats in the sound reproduction assembly to make a seamless interface to the linear adaptive loudspeaker model. Hence, the present methodology preferably comprises steps of:
    sampling and digitizing the voice coil current to generate a digital voice coil current signal at a first sampling frequency,
    sampling and digitizing the voice coil voltage to generate a digital voice coil voltage signal at the first sampling frequency.

The audio input signal is preferably utilized in digital format in the present methodology. Hence, the audio input signal may be provided as a digital audio input signal in some embodiments and as an analog audio input signal that is sampled and digitized after receipt in the in other embodiments. Hence, the methodology may also comprises steps of:
    receiving the audio input signal as a digital audio input at a second sampling frequency or receiving, sampling and digitizing the audio input signal to produce the digital audio input signal at the second sampling frequency.

The second sampling frequency may be standardized digital audio sampling frequency, e.g. a sampling frequency between 16 kHz and 96 kHz such as 32, 44.1 or 48 kHz etc.

According to an advantageous embodiment of the methodology, the first sampling frequency is selected to a lower frequency than the second sampling frequency. The first sampling frequency may for example be less than one-half or one-fourth of the second sampling frequency. The lower value of the first sampling frequency reduces the computational load incurred by the adaptive linear digital loudspeaker model and by the non-linear state space model so as to reduce power consumption of the signal processor.

A second aspect of the invention relates to a sound reproduction assembly for an electrodynamic loudspeaker. The sound reproduction assembly comprises an audio signal input for receipt of an audio input signal supplied by an audio signal source—An output amplifier is configured to receive the audio input signal and generate a corresponding audio output signal as a voice coil voltage at a pair of output terminals connectable to a voice coil of an electrodynamic loudspeaker. The assembly further comprises a current detector configured for detecting a voice coil current flowing into the electrodynamic loudspeaker in response to the application of the voice coil voltage. A signal processor of the assembly is configured to:

applying the detected voice coil current and the determined voice coil voltage to a linear adaptive digital model of the electrodynamic loudspeaker, computing a plurality of parameter values of the plurality of respective adaptive loudspeaker parameters based on the linear adaptive digital loudspeaker model, applying the plurality of parameter values to a non-linear state-space model of the electrodynamic loudspeaker, applying, in the non-linear state-space model, a predetermined non-linear function representing a non-linear relationship between a loudspeaker parameter and a predetermined loudspeaker variable to at least one of the plurality of received parameter values to compute at least one non-linearity compensated parameter value, applying the audio input signal to the non-linear state-space model of the electrodynamic loudspeaker, determining an instantaneous excursion of the diaphragm based on the audio input signal and the non-linear state-space model of the electrodynamic loudspeaker.

The properties of the output amplifier have been disclosed in detail above in connection with the corresponding excursion detection methodology. The Class D output amplifier may comprises a half-bridge driver stage with a single output coupled to the electrodynamic loudspeaker or a full-bridge/H-bridge driver stage with the pair of output terminals coupled to respective sides or terminals of the electrodynamic loudspeaker. The audio input signal may comprise a real-time digital audio signal supplied from an external digital audio source such as a digital microphone. The real-time digital audio signal may be formatted according to a standardized serial data communication protocol such as I²C or SPI, or formatted according to a digital audio protocol such as I²S, SPDIF etc.

The skilled person will appreciate that the signal processor preferably comprises a programmable microprocessor controllable by an application program comprising a set of executable program instructions stored in a program memory. The programmable microprocessor may comprise a software programmable DSP integrated on, or operatively coupled to, the sound reproduction assembly. The application program may comprise a first set of executable program instructions computing, when executed, the plurality of parameter values of the plurality of respective adaptive loudspeaker parameters of the linear adaptive digital loudspeaker model. In some embodiments of the invention the signal processor may form an integral part of an application processor of the portable communication device while the signal processor in other embodiments of the invention may be a dedicated microprocessor or DSP of the assembly.

The skilled person will appreciate that the current detector may comprise various types of current sensors for example a current mirror connected to an output transistor of the output amplifier or a small sense resistor coupled in series with the loudspeaker voice coil. The voice coil current may accordingly be represented by a proportional/scaled sense voltage. The voice coil voltage and the voice coil current are preferably represented in digital formats in the sound reproduction assembly to make a seamless interface to the linear adaptive loudspeaker model. Hence, the current detector comprise preferably comprises a first A/D converter configured to sample and digitize the voice coil current to supply a digital voice coil current signal at a first sampling frequency and the voice coil voltage detector comprising a second A/D converter configured to sample and digitize the voice coil voltage at the first sampling frequency to generate a digital voice coil voltage signal.

In a preferred embodiment of the sound reproduction assembly the signal processor is additionally configured to comparing the instantaneous diaphragm excursion with a predetermined limit criterion and limiting the excursion of the diaphragm based on a result of the comparison.

A third aspect of the invention relates to a semiconductor substrate or die on which a sound reproduction assembly according to any of the above-described embodiments is integrated. The semiconductor substrate may be fabricated in a suitable CMOS or DMOS semiconductor process.

A fourth aspect of the invention relates to a portable communication device comprising a sound reproduction system according to any of the above-described embodiments thereof.

A fifth aspect of the invention relates to a method of determining an average non-linear function between a loudspeaker parameter and a loudspeaker variable of an electrodynamic loudspeaker, comprising steps of:

a) applying test signal to each loudspeaker of a plurality of electrodynamic loudspeakers of the same type wherein the test signal is configured to excite a particular relationship between the loudspeaker variable and the loudspeaker parameter across a predetermined range of the loudspeaker variable b) recording a plurality of parameter values of the loudspeaker parameter across the predetermined range of the loudspeaker variable for each loudspeaker of the plurality of loudspeakers, c) normalizing the plurality of recorded parameter values of the loudspeaker parameter for each loudspeaker at a common reference value of the loudspeaker variable, d) computing an average value of the plurality of normalized parameter values of the loudspeaker variable for the plurality of electrodynamic loudspeakers of the same type across the predetermined range of the loudspeaker variable for representing the average non-linear function between the loudspeaker parameter and the loudspeaker variable.

The loudspeaker parameter may comprises one of a force factor (B*I) and a suspension compliance or stiffness of the plurality of electrodynamic loudspeakers of the same type. In addition, the loudspeaker variable may comprise a diaphragm excursion or displacement of the plurality of electrodynamic loudspeakers of the same type.

The normalization of the plurality of recorded parameter values according to step c) preferably comprises increasing or decreasing each of the plurality of recorded parameter values for each loudspeaker at the common reference value of the loudspeaker variable such that all parameter values of the loudspeaker parameter are substantially equal at the common reference value. The common reference value of the loudspeaker variable may for example be zero diaphragm excursion.

BRIEF DESCRIPTION OF THE DRAWINGS

Preferred embodiments of the invention will be described in more detail in connection with the appended drawings, in which.

DETAILED DESCRIPTION OF PREFERRED EMBODIMENTS

Figure 1:
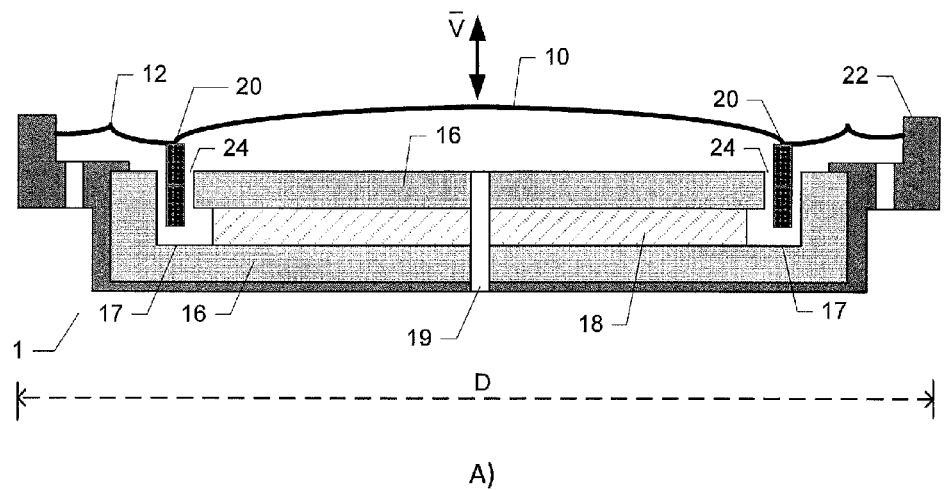
FIG. 1A) is a schematic cross-sectional view of an exemplary miniature electrodynamic loudspeaker for various portable sound reproducing applications for use in the present invention, FIG. 1B) is a schematic cross-sectional view of the exemplary miniature electrodynamic loudspeaker mounted in an enclosure with acoustic leakage.
Figure 1:
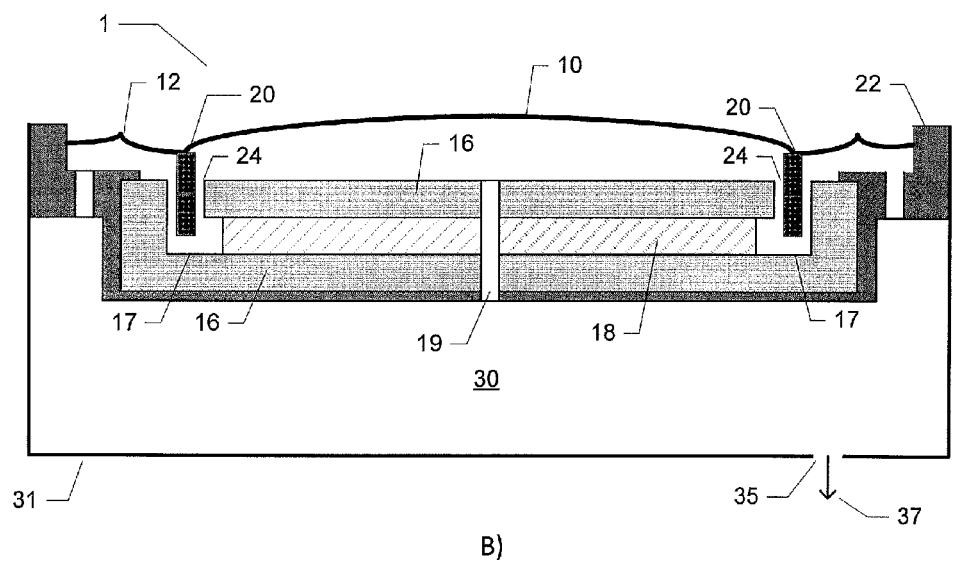

FIG. 1A) is a schematic cross-sectional illustration of a typical miniature electrodynamic loudspeaker 1 for sealed box mounting and use in portable audio applications such as mobile phones and smartphones where the loudspeaker 1 provides sound reproduction for various types of applications such as speaker phone and music playback. The skilled person will appreciate that electrodynamic loudspeakers exist in numerous shapes and sizes depending on the intended application. The electrodynamic loudspeaker 1 used in the below described methodologies of estimating diaphragm excursion and the corresponding assemblies for estimating diaphragm excursion has a rectangular shape with maximum outer dimension, D, of approximately 15 mm and an outer dimension in transversal direction of about 11 mm. However, the skilled person will appreciate that the present methodologies for estimating diaphragm excursion of electrodynamic loudspeakers are applicable to virtually all types of electrodynamic loudspeakers.

The miniature electrodynamic loudspeaker 1 comprises a diaphragm 10 fastened to an upper edge surface of a voice coil. The diaphragm 10 is also mechanically coupled to a speaker frame 22 through a resilient edge or outer suspension 12. An annular permanent magnet structure 18 generates a magnetic flux which is conducted through a magnetically permeable structure 16 having a circular air gap 24 arranged therein. A circular ventilation duct 14 is arranged in the frame structure 22 and may be used to conduct heat away from an otherwise sealed chamber structure formed d beneath the diaphragm 10. The resilient edge suspension 12 provides a relatively well-defined compliance of the movable diaphragm assembly (voice coil 20 and diaphragm 10). The compliance of the resilient edge suspension 12 and a moving mass of the diaphragm 10 determines the free-air fundamental resonance frequency of the miniature loudspeaker. The resilient edge suspension 12 may be constructed to limit maximum excursion or maximum displacement of the movable diaphragm assembly.

During operation of the miniature loudspeaker 1, a voice coil voltage or drive voltage is applied to the voice coil 20 of the loudspeaker 100 thorough a pair of speaker terminals (not shown) electrically connected to a suitable output amplifier or power amplifier. A corresponding voice coil current flows in response through the voice coil 20 leading to essentially uniform vibratory motion, in a piston range of the loudspeaker, of the diaphragm assembly in the direction indicated by the velocity arrow V. Thereby, a corresponding sound pressure is generated by the loudspeaker 1. The vibratory motion of the voice coil 20 and diaphragm 10 in response to the flow of voice coil current is caused by the presence of a radially-oriented magnetic field in the air gap 24. The applied voice coil current and voltage lead to power dissipation in the voice coil 20 which heats the voice coil 20 during operation. Hence, prolonged application of too high drive voltage and current may lead to overheating of the voice coil 20 which is another common cause of failure in electrodynamic loudspeakers.

The application of excessively large voice coil currents which force the movable diaphragm assembly beyond its maximum allowable excursion limit is another common fault mechanism in electrodynamic loudspeakers leading to various kinds of irreversible mechanical damage. One type of mechanical damage may for example be caused by collision between the lowermost edge of the voice coil 20 and an annular facing portion 17 of the magnetically permeable structure 16. The maximum excursion of a particular type of electrodynamic loudspeaker depends on its dimensions and construction details. For the above-discussed miniature loudspeaker 1 with outer dimensions of approximately 11 mm×15 mm, the maximum allowable diaphragm excursion is typically about +/−0.45 mm.

FIG. 1B) is a schematic cross-sectional illustration of the miniature electrodynamic loudspeaker 1 mounted in an enclosure, box or chamber 31 having a predetermined interior volume 30. The enclosure or chamber 31 is arranged below the diaphragm 10 of the loudspeaker 1. An outer peripheral wall of the frame structure 22 of the loudspeaker 1 is firmly attached to a mating wall surface of the sealed box 31 to form a substantially air tight coupling acoustically isolating the trapped air inside volume 30 from the surrounding environment. The enclosed volume 30 may be between 0.5 and 2.0 cm³ such as about 1 cm³ for typical portable communication device or terminal applications like mobile phones and smartphones. The skilled person will appreciate that the present invention can be used to control diaphragm excursion of loudspeakers mounted in the depicted type of substantially acoustic sealed enclosures, the present invention can also be exploited to control diaphragm excursion of loudspeakers in different type of acoustic mounting arrangements.

The mounting of the loudspeaker 1 in the sealed enclosure 30 leads to a higher fundamental resonance frequency of the miniature loudspeaker than its free-air fundamental resonance frequency discussed above due to a compliance of the trapped air inside the chamber 30. The compliance of the trapped air inside the chamber 30 works in parallel with the compliance of the resilient edge suspension 12 to decrease the total compliance (i.e. increase the stiffness) acting on the moving mass of the loudspeaker. Therefore, the fundamental resonance frequency of the enclosure mounted loudspeaker 1 is higher than the free air resonance. The amount of increase of fundamental resonance frequency depends on the volume of the enclosure 30. The wall structure surrounding the sealed enclosure 31 may be a formed by a molded elastomeric compound with limited impact strength. Under certain operating conditions, the sealed enclosure may by accident be broken e.g. by small hole or crack 35 in the wall structure 31 of the enclosure 30. This type of enclosure hole or crack leads to undesired acoustic leakage of enclosure sound pressure to the surrounding environment as schematically illustrate indicated by the arrow 37. The acoustic leakage is generally undesired and tends to decrease the fundamental resonance frequency of the loudspeaker 1 as discussed above. This change of the fundamental resonance frequency can optionally be detected by monitoring the associated change of an electrical impedance of the loudspeaker 1 as described in further detail below.

Figure 2:
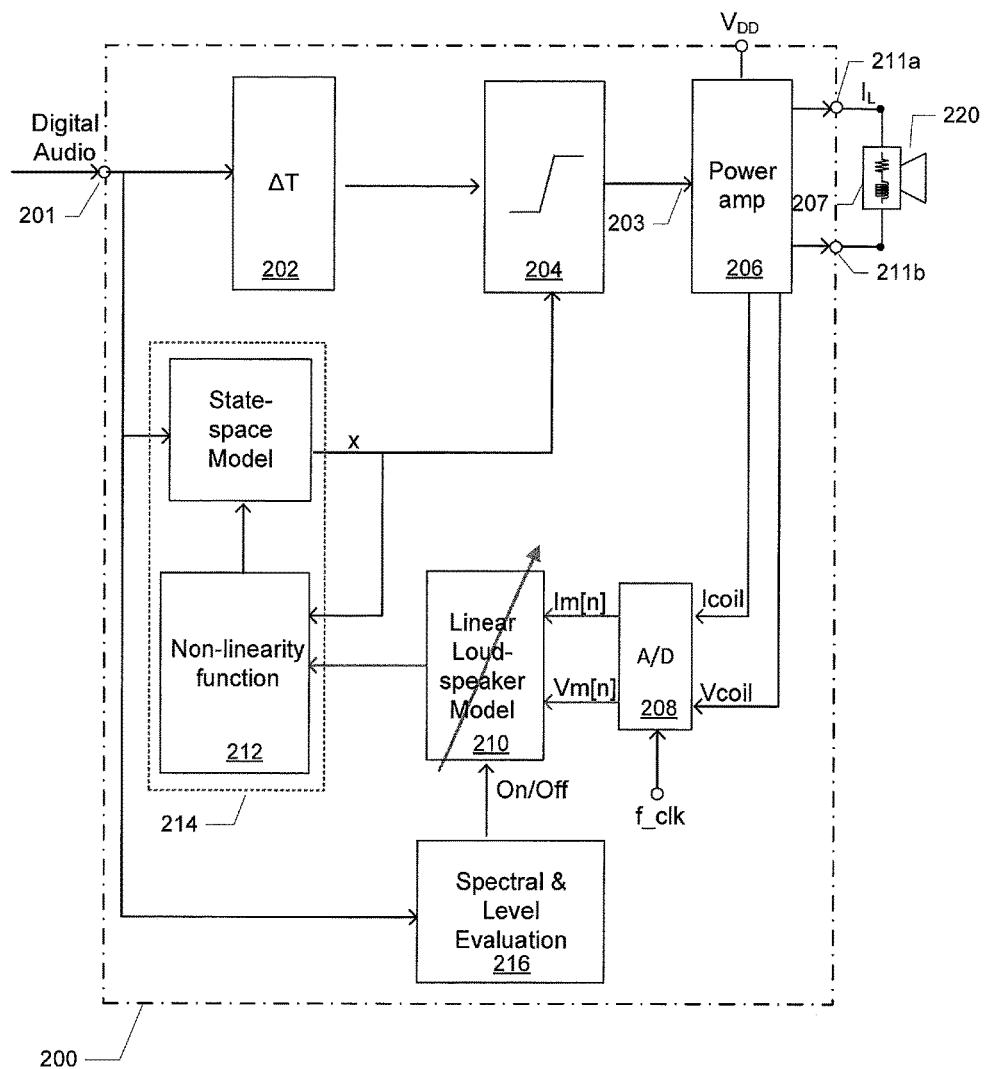
FIG. 2 shows a schematic block diagram of a sound reproduction assembly coupled to an electrodynamic loudspeaker in accordance with a first embodiment of the invention.

FIG. 2 is a simplified schematic block diagram of a sound reproduction assembly 200 for diaphragm excursion estimation, and preferably also excursion limitation, of electrodynamic loudspeakers of portable communication devices and other types of audio enabled portable computing devices. The sound reproduction assembly may for example be used to control sound reproduction of the miniature loudspeaker 1 illustrated on FIG. 1A) or 1B) above. The sound reproduction assembly 200 is coupled to the miniature electrodynamic loudspeaker 1 through a pair of externally accessible speaker terminals 211a, 211b. A pulse modulated Class D output amplifier 206 may comprise an H-bridge output stage supplying the audio output signal in pulse modulated format across a voice coil of the loudspeaker through the pair of speaker terminals 211a, 211b. The class D output amplifier receives a processed digital audio signal at amplifier input 203, derived from a digital audio input signal supplied at digital audio signal input 201 of the assembly 200. The digital audio input signal at the input terminal or pad 201 may be supplied by an external digital audio signal source at a first sampling frequency e.g. a sampling frequency between 16 kHz and 96 kHz. The external digital audio signal source may comprise a digital audio port or interface of an application processor of a portable communication device in which the present sound reproduction assembly 200 is integrated. The externally generated digital audio signal may be formatted according to a standardized serial data communication protocol such as I²C or SPI, or formatted according to a digital audio protocol such as I²S, SPDIF etc.

The sound reproduction assembly 200 comprises a delay circuit or function 202 which delays the digital audio input signal with a predetermined time delay for example smaller than 8 ms and preferably smaller than 4 ms. The delayed digital audio input signal is transmitted to an audio level limiting circuit or function 204 which is configured to reduce the excursion of the diaphragm of the loudspeaker by attenuating or limiting the level of the processed digital audio signal at the amplifier input 203 in accordance with the detected instantaneous diaphragm excursion, x, computed by a non-linear state-space loudspeaker model 214. The delay time allows the limitation of the level of the processed digital audio signal to react substantially instantaneously when the estimated instantaneous diaphragm excursion, x, exceeds the maximum excursion limit of the loudspeaker and thereby improves the effectiveness of the protection. However, a too large delay time may introduce problems in real-time application of the sound reproduction assembly such as voice communication in mobile/smartphone applications.

The sound reproduction assembly 200 further comprises a linear adaptive digital model 210 of the electrodynamic loudspeaker 220 comprising a plurality of adaptable or adaptive model parameters that are adjusted in response to a digital voice coil current signal Im[n] and a digital voice coil voltage Vm[n]. The adaptive linear digital model 210 of the loudspeaker preferably comprises an adaptive filter which models a frequency dependent impedance of the loudspeaker 220 across a predetermined audio frequency range, for example between 10 Hz and 10 kHz, based on the detected or measured voice coil current and voice coil voltage as represented by the digital voice coil current signal Im[n] and the digital voice coil voltage Vm[n]. The linear adaptive digital loudspeaker model 210 comprises a plurality of adaptive loudspeaker parameters. The linear adaptive digital loudspeaker model 210 is configured for computing a plurality of respective parameter values of the linear loudspeaker parameters. The details of the functionality of the adaptive linear digital loudspeaker model 210 are discussed in further detail below with reference to FIG. 3. The adaptive linear digital loudspeaker model 210 may for example be configured to computing or tracking a time-varying impedance versus frequency function of the electrodynamic loudspeaker 220. The respective parameter values of various important linear loudspeaker parameters may be derived from the values of the time-varying model parameters tracking the impedance function or curve of the loudspeaker 220. The output of the linear adaptive digital loudspeaker model 210 comprises a plurality of parameter values of the respective linear, albeit time-varying, adaptive loudspeaker parameters, for example a force factor or suspension compliance of the enclosure mounted miniature loudspeaker, which are supplied to a non-linear function block 212 which is a part of a non-linear state-space model 214 of the electrodynamic loudspeaker. Hence, the parameter values of the adaptive loudspeaker parameters represent or estimate respective current parameter values of the respective adaptive loudspeaker parameter such that the previously discussed time-varying and temperature varying properties of each of these are appropriately tracked.

For the purpose of delivering the digital voice coil current signal Im[n] and a digital voice coil voltage signal Vm[n] to the adaptive linear digital model 210, the sound reproduction assembly 200 comprises at least one A/D converter 208 that generates the digital voice coil current signal Im[n] and a digital voice coil voltage signal Vm[n] by sampling and digitizing the instantaneous voice coil voltage across the speaker terminals 211a, 211b. The A/D converter 208 furthermore comprises a second input that is configured to sample and digitize an analog voice coil current delivered at a second input, Icoil, of the converter 208. The digital voice coil current signal Im[n] and the digital voice coil voltage signal Vm[n] are preferably sampled at the same sampling frequency which may be identical to the first sampling frequency of the digital audio input signal previously discussed. The sampling frequency of the digital voice coil current signal Im[n] and the digital voice coil voltage signal Vm[n] may alternatively be lower than the first sampling frequency for example less than one-half thereof to reduce the computational load on a digital signal processor implementing the adaptive linear digital model 210 in the present sound reproduction assembly 200. The skilled person will appreciate that the least one A/D converter 208 may comprise a multiplexed type of converter alternatingly sampling the voice coil voltage and analog voice coil current signal. Alternatively, the least one A/D converter 208 may comprise two separate A/D converters fixedly coupled to the voice coil voltage and the voice coil current signal, respectively. The skilled person will appreciate that the voice current signal may be generated by various types of current sensors that generate a voltage, current or charge signal proportional to the instantaneous voice coil current flowing the voice coil.

In the non-linear parameter block 212, respective non-linear functions are preferably applied to one or more of the incoming parameter values of the adaptive loudspeaker parameters to compute one or more corresponding non-linearity compensated parameter values. The non-linearity compensated parameter value(s) takes into account the non-linear behaviour or property of the loudspeaker parameter(s) in question relative to a certain loudspeaker variable. This could for example be the non-linear dependency of the force factor (B*I) of the electrodynamic loudspeaker on the diaphragm displacement or a non-linear dependency of the force factor (B*I) of the electrodynamic loudspeaker on the voice coil current.

Clearly, just a few or a single one of the incoming parameter values of the adaptive loudspeaker parameters supplied by the adaptive linear digital loudspeaker model 210 may be subjected to the non-linear function(s) and respective non-linearity compensated parameter value(s) computed. Residual ones of the incoming parameter values of the residual adaptive loudspeaker parameters may be left without non-linear compensation and utilized directly in the non-linear state-space model 214 in effect bypassing the non-linear parameter block 212. The skilled person will appreciate that utilizing a large number of non-linear functions in the non-linear parameter block 212 will generally improve the accuracy of the computed loudspeaker parameter values in the non-linear state-space model 214. This improved accuracy may however be reached at the cost of increased computational load. Consequently, the accuracy requirements for the excursion prediction or estimation will vary between different types of applications and user requirements such that the number of non-linear functions applied in the non-linear parameter block 212 is adapted to the application relevant requirements. The computed instantaneous excursion of the loudspeaker diaphragm, x, is fed back to a second input of the non-linear parameter block 212 to allow the latter to calculate updated non-linearity compensated parameter value(s) based on a previous value of x.

The characteristics of each of the predetermined non-linear functions have preferably been determined in connection with certain experimental measurements on a suitable set or collection of representative electrodynamic loudspeakers of the same make and model as the active electrodynamic loudspeaker 220. The individually determined non-linear relationship between the selected loudspeaker variable and the loudspeaker parameter in question has been measured for each loudspeaker sample during the calibration measurements. The average non-linear functional relationship across the batch of representative electrodynamic loudspeakers has been determined as described in additional detail below. This average non-linear functional relationship may be defined by various mechanisms such as one or more polynomial coefficient(s) representing a polynomial curve fit between the selected loudspeaker variable and the loudspeaker parameter in question. In another embodiment, the average non-linear functional relationship may be defined by a look-up table which maps the loudspeaker variable into corresponding non-linearity compensated values of the loudspeaker parameter. Hence, a plurality of look-tables may be utilized to map average non-linear functional relationships between the loudspeaker variable and the respective non-linearity compensated parameter values of the loudspeaker parameters. The look-up table or tables may be stored in a suitable non-volatile memory address space of the sound reproduction assembly or at least a non-volatile memory space accessible for reading by the DSP of the sound reproduction assembly. In the latter situation, the skilled person will appreciate that the non-volatile memory address space of may be situated in a data memory device of an application processor of the portable communication device. In both instances, the content of the look-up table or tables is preferably read into the non-linear parameter block 212 from the appropriate non-volatile memory address space for example in connection with initialization of the sound reproduction assembly 200.

The measurement and subsequent use of these average non-linear relationships between the selected loudspeaker variable and the loudspeaker parameter in question in the non-linear parameter block 212 is advantageous as it eliminates the need to make complex calibration measurements to determine the non-linear behaviour of the loudspeaker parameter or parameters during manufacturing of the portable communication device or during active or on-line operation of the assembly during reproduction of speech and music signals.

The effect of the adaptive or tracking property of the parameter values of the plurality of linear loudspeaker parameters computed by the linear adaptive digital loudspeaker model 210 is that the linear, albeit time-varying, loudspeaker model remains accurate over time despite changes of environmental conditions, such as humidity and temperature, material aging and changes in acoustic operating conditions of the loudspeaker (e.g. enclosure leakage). The linear adaptive digital model 210 is capable of tracking such relatively slowly varying changes of the parameter values of the adaptive loudspeaker parameters caused by these factors. On the other hand, to make an accurate determination of the instantaneous excursion of the loudspeaker diaphragm and thereby able to prevent the mechanical damage described earlier it remains highly advantageous to use a non-linear model of the loudspeaker such that large signal induced non-linear effects of the parameter values of the loudspeaker parameters are taking into proper account. The latter feature makes it feasible to accurately predict or estimate the instantaneous excursion of the loudspeaker diaphragm, x, despite pronounced non-linearities of the relevant loudspeaker parameters. Important loudspeaker parameters such as the force factor (B*I) and suspension compliance or stiffness influence the diaphragm excursion and exhibit an excursion dependent behaviour or property such that the value of the force factor is reduced with increasing diaphragm excursion of displacement. Likewise, the value of the suspension compliance decreases with increasing diaphragm excursion for typical loudspeaker constructions.

A third input of the non-linear state-space model 214 receives the digital audio input signal from the input terminal 201 and based on the digital audio input signal, the parameter values and non-linearity compensated parameter value(s) of the adaptive loudspeaker parameters, the non-linear state-space model 214 estimates the instantaneous diaphragm excursion, x, and supplies this quantity to the previously discussed amplitude or level limiter function 204. The level limiter function 204 compares the estimated instantaneous diaphragm excursion, x, with a predetermined excursion limit or threshold. The predetermined excursion limit or threshold will typically indicate the maximum allowable or recommended diaphragm displacement or excursion for the particular type of loudspeaker 220. Hence, the maximum allowable or recommended diaphragm displacement may be set according to the loudspeaker manufacturer's recommendations.

If the instantaneous diaphragm excursion, x, is smaller than the predetermined excursion limit, the level limiter function 204 may transmit the delayed digital audio input signal to the input of the output amplifier 206 without attenuation or level limiting. On the other hand, if the instantaneous diaphragm excursion, x, exceeds the predetermined excursion limit, the level limiter function 204 is adapted to attenuate or limit the delayed digital audio input signal before transmission to the output amplifier 206. The attenuation is preferably accomplished by selectively attenuating a low-frequency sub-band of the delayed digital audio input signal such as a low-frequency band below 800 Hz or 500 Hz while higher frequencies remain un-attenuated. This is often very effective for protection purposes because low-frequency audio signal components are most likely to drive the loudspeaker diaphragm outside its maximum allowable excursion limit. The low-frequency band may comprise all frequencies below a certain threshold frequency such as 800 Hz or 500 Hz or only a single low-frequency band such as one-third octave band around a center frequency such as 400 Hz or 300 Hz in the low-frequency range. In another embodiment, there is not any small-signal attenuation of the low-frequency band but instead a non-linear amplitude level limiter is applied to the delayed digital audio input signal to limits the peak level for example by automatic gain control or possible a peak clipper.

The skilled person will appreciate that each of the above discussed signal processing circuits, functions or models 202, 204, 210, 212, 214 and 216 may be implemented as a set of executable program instructions, or program routines, executed on a software programmable microprocessor core or DSP core. In the latter embodiments, the adaptive linear digital loudspeaker model 210 may be implemented by a dedicated set of executable program instructions and a plurality of data memory locations holding the plurality of adaptable model parameters of the model 210. The skilled person will understand that the programmable DSP core may be integrated together with the previously discussed application processor of the portable communication terminal or be implemented as a separate programmable or hard-wired DSP core configured to perform the above-described signal processing circuits, functions or models 202, 204, 210, 212, 214 and 216. The skilled person will understand that some of the signal processing circuits, functions or models 202, 204, 210, 212, 214 and 216 may be implemented as respective sets of executable program instructions while any residual signal processing circuits, functions or models may be implemented as a separate hard-wired digital logic circuits comprising appropriately configured sequential and combinatorial digital logic. The hard-wired digital logic circuit may be integrated on an Application Specific Integrated Circuit (ASIC) or configured by programmable logic or any combination thereof.

The sound reproduction assembly 200 comprises an optional signal adaptation control processing function or block 216 that is configured to interrupt or halt the previously discussed adaptation of the adaptive loudspeaker parameters of the adaptive linear digital loudspeaker model 210 under certain unfavourable conditions of the digital audio input signal. The signal adaptation control block 216 is preferably comparing the audio input signal with a predetermined signal level criterion and/or a predetermined spectral criterion and interrupting adaptation of the plurality of adaptive loudspeaker parameters based on a result of the comparison. The signal adaptation control block 216 may for example compute consecutive signal spectra of the digital audio input signal and compare each of the computed signal spectra to the spectral criterion. If the signal spectrum of the digital audio input signal has a smaller bandwidth than preset signal bandwidth defined by the predetermined spectral criterion, the adaptation is interrupted. This ensures that adaptation of the plurality of adaptive loudspeaker parameters is interrupted if the digital audio input signal is a pure tone, or other narrow band audio signal, which tends to derail adaptive filter algorithms such as Least Mean Squares. This type of adaptive filter algorithms may be applied by the adaptive linear digital loudspeaker model 210 as explained in further detail below.

The sound reproduction assembly 200 is supplied with operating power from a positive power supply voltage $V_{DD}$. Ground (not shown) or a negative DC voltage may form a negative supply voltage for the loudspeaker excursion detector 200. The DC voltage of $V_{DD}$ may vary considerably depending on the particular application of the sound reproduction assembly 200 and may typically be set to a voltage between 1.5 Volt and 100 Volt. A clock signal input, f:clk sets a clock frequency of the A/D converter 208.

Figure 3:
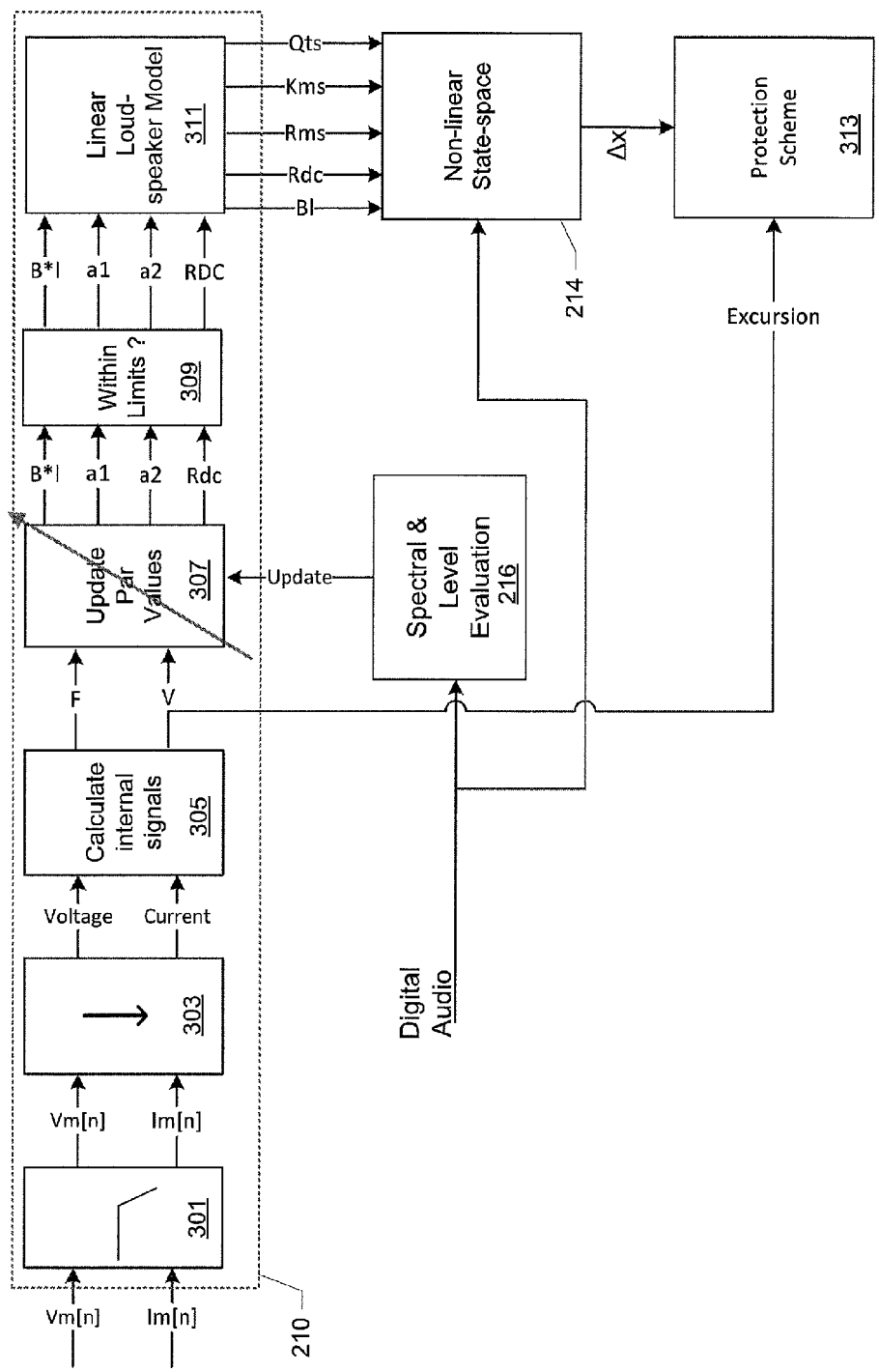
FIG. 3 shows a detailed schematic block diagram of selected signal processing functions and block of the sound reproduction assembly depicted on FIG. 2.

FIG. 3 shows a detailed schematic block diagram of the preferred signal processing functions applied in the adaptive linear digital loudspeaker model 210 depicted on FIG. 2. The same features in FIGS. 2 and 3 have been supplied with the same reference numerals to ease comparison. As discussed above, the digital voice coil current signal Im[n] and the and the digital voice coil voltage signal Vm[n] are applied to respective inputs of the adaptive digital loudspeaker model 210. Each of the Im[n] and Vm[n] signals are lowpass filtered by a digital lowpass filter 301 and applied to an input of a decimator 303 which down samples each of the Im[n] and Vm[n] signals from the first sampling frequency of the digital audio input signal to a significantly lower sampling frequency such as less than 0.5, 0.25 or 0.125 times the first sampling frequency. This combined lowpass filtering and down sampling operation reduces the sample rate of the signals in the adaptive linear digital loudspeaker model 210 and other signal processing functions of the assembly leading to a reduction of computational load and reduced power consumption.

The lowpass filtered and down sampled Im[n] and Vm[n] signals are supplied to an internal signal calculation block 305 which derives or computes a force signal F and a voice coil voltage signal V that are applied to an adaptive digital impedance or admittance model 307 of the electrodynamic loudspeaker The adaptive operation of the adaptive digital impedance model 307 is explained below in additional detail below with reference to FIG. 4. The adaptive digital impedance model 307 is configured to adaptively computing and outputting the illustrated four adaptive model parameters, $R_{DC}$ (DC electrical resistance of voice coil) B*I (force factor) and a1 and a2 which are z-domain impedance model parameters as described below. Each of the parameter values of the four adaptive model parameters is optionally checked against certain preset parameter limits in processing block 309 to verify that the adaptive digital impedance model 307 appears to work correctly, e.g. that the impedance model is not diverging and outputs sensible parameter values. The processing block 309 may include certain loudspeaker specific data that improves adaptation speed of the adaptive digital impedance model 307.

The computed values of the four adaptive model parameters are subsequently transmitted to a loudspeaker model 311 which converts the four adaptive model parameters into previously discussed plurality of parameter values of the plurality of adaptive loudspeaker parameters outputted by the linear adaptive digital loudspeaker model 210. In the present embodiment, the loudspeaker model 311 has been configured to compute the following five adaptive loudspeaker parameters as illustrated on the figure: $R_{DC}$ (DC electrical resistance of voice coil); B*I (Force factor); $R_{MS}$ (Total mechanical damping); $K_{MS}$ (Total mechanical stiffness) and $Q_{TS}$ (Total damping factor). The skilled person will appreciate that other adaptive loudspeaker parameters may be selected in other embodiments of the invention provided the parameter selection gives sufficiently detailed loudspeaker information to the non-linear state space model 214.

A protection scheme block or function 313 comprises the previously discussed amplitude or level limiter function 204 operating in accordance with the computed or estimated value of the instantaneous excursion computed by the non-linear state-space model 214. The skilled person will understand that the protection scheme block 313 preferably comprises additional protection mechanisms for the electrodynamic loudspeaker such as thermal protection which, however, lies outside the scope of the present disclosure.

Figure 4:
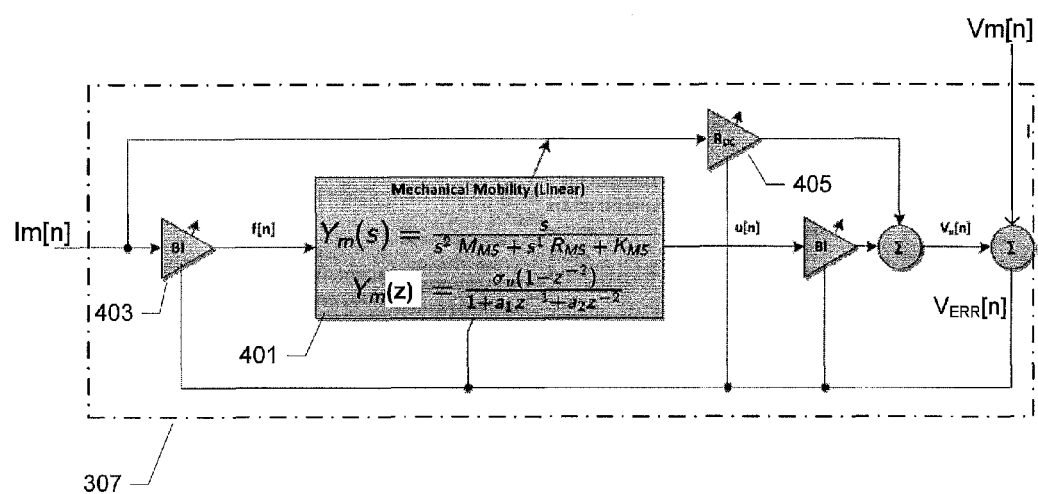
FIG. 4 shows an adaptive IIR filter based impedance model of the electrodynamic loudspeaker for determination of a plurality of adaptive model parameters.

FIG. 4 is a detailed view of interior signal processing components or computational blocks of the previously discussed an adaptive digital impedance or admittance model 307 of the electrodynamic loudspeaker. The adaptive digital impedance or admittance model 307 of the electrodynamic loudspeaker comprises an adaptive $2^{nd}$ order IIR filter 401 which adaptively tracks or models a time-varying impedance of the voice coil of the miniature electrodynamic loudspeaker reflecting inter alia a fundamental resonance frequency of the loudspeaker. The previously discussed digital voice coil current signal Im[n] is applied to a first input of the adaptive digital loudspeaker model 210 and the digital voice coil voltage signal Vm[n] is applied to a second input of the adaptive digital impedance model 307. The parameter outputs (not shown) of the adaptive digital impedance or admittance model 307 are the previously discussed four adaptive model parameters, $R_{DC}$ (DC electrical resistance of voice coil); B*I (Force factor) and a1 and a2. These four adaptive model parameters are depicted inside the internal computational blocks 401, 403 and 405.

The adaptive impedance model 307 comprises the following model parameters of the electrodynamic loudspeaker:
  $V_e$[n]: Estimate of voice coil voltage or drive voltage;
  $R_{DC}$: DC electrical resistance of voice coil;
  BI: Force factor of loudspeaker (B·I product);
  $M_{MS}$: Total mechanical moving mass (including acoustic loading);
  $K_{MS}$: Total mechanical stiffness;
  $R_{MS}$: Total mechanical damping;
The adaptive IIR filter 401 is a second order filter and for convenience preferably expressed by its mechanical mobility transfer function $Y_m$(z) in the z-domain as illustrated by the lower mobility equation. The overall operation of the adaptive digital impedance model 307 is that a parameter tracking algorithm seeks to predict the voice coil voltage $V_e$[n] based upon a measurement of the voice coil current Im[n] and a preselected impedance model of the loudspeaker. The skilled person will appreciate that present adaptive digital impedance model 307 is applicable for a sealed enclosure mounted electrodynamic loudspeaker. An error signal $V_{ERR}$[n] is obtained from a difference between the measured, actual, voice coil voltage signal Vm[n] and an estimate of the same produced by the model, $V_e$[n]. The skilled person will understand that various adaptive filtering methods such as LMS may be used to adapt free model parameters in the chosen loudspeaker impedance model to minimise the error signal $V_{ERR}$[n]. The free model parameters are preferably continuously transmitted to the DSP and when the error signal becomes sufficiently small, e.g. comply with a predetermined error criterion, the adapted model parameters are assumed to be correct. By keeping fixed one of the four parameters BI, $M_{MS}$, $K_{MS}$ and $R_{MS}$ depicted in block 401 of FIG. 4 the residual three parameters can be determined by identifying the relationship between Im[n] and Vm[n]. Mathematically, it is unimportant which one of these four parameters that is fixed, but the total moving mass $M_{MS}$ is typically a good choice because it is often the most stable of these parameters in terms of manufacturing spread and variation over time and temperature.

Figure 5:
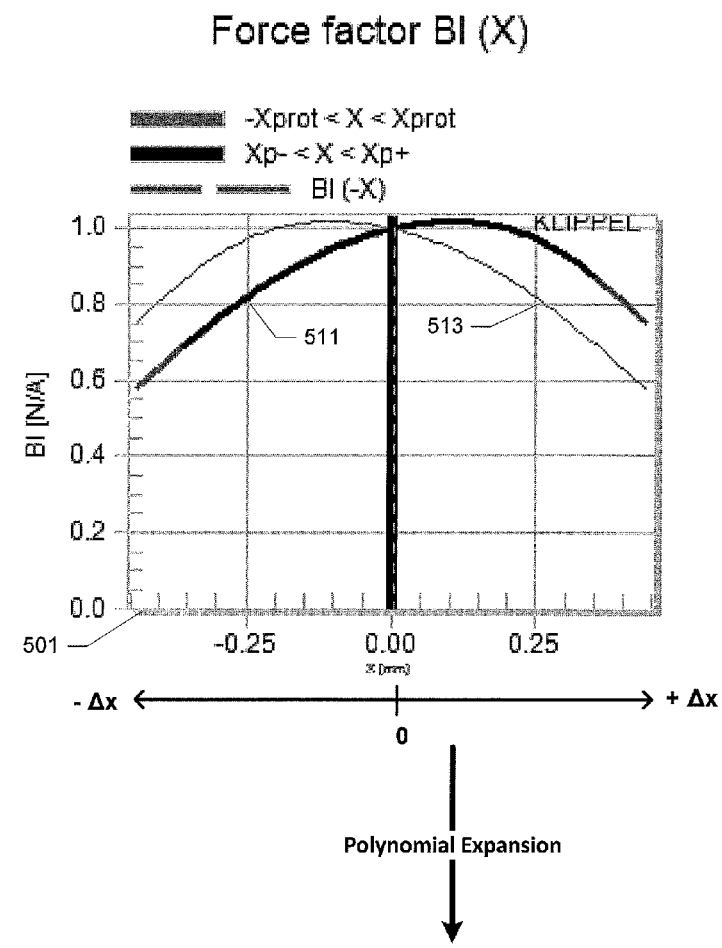
FIG. 5 is graph of an experimentally measured average non-linear behaviour of a force factor (B*I) versus diaphragm displacement and computed corresponding polynomial coefficients representing a polynomial curve fit between the force factor (B*I) and the diaphragm displacement.

FIG. 5 comprise a graph 501 of an experimentally measured average non-linear behaviour of a force factor (B*I) versus diaphragm displacement indicated by curve 511. The mirrored curve 513 is simply a help curve that is computed and displayed by the measurement system to allow visual assessment of the degree of symmetry of the depicted non-linear relationship. The same applies for the mirrored curve 613 of FIG. 6. The average curve 501 has been obtained by measuring and averaging the individual force factor versus diaphragm displacement characteristics for 5 representative loudspeaker samples of the same make and model as the electrodynamic loudspeaker 1 depicted on FIG. 1. The five representative loudspeaker samples were selected from different production lots or batches to include variations of the loudspeaker parameters in the course of manufacturing. The individual force factor versus diaphragm displacement characteristics for each of the 5 representative loudspeaker samples have been measured by a laser displacement sensor which is a component of the utilized KLIPPEL R&D SYSTEM for loudspeaker characterization. The results of these individual force factor versus diaphragm displacement characteristics were exported to a proprietary software analysis program, e.g. based on MATLAB, developed by the inventors. The software analysis program computed an average measured force factor for the 5 representative loudspeaker samples and provided the graphical display of the result depicted on graph 501. The Y-axis depicts the measured average force factor on a dimension less relative scale and the X-axis depicts the diaphragm excursion or displacement, x in mm in outward and inward direction. The force factor (B*I) has accordingly been measured for a range of +/−0.45 mm of diaphragm displacement. As illustrated by the average force factor versus diaphragm displacement curve 511, there is a significant variation of the measured average force factor, in the order of 40%, across the depicted displacement range. A polynomial curve fit to the average force factor versus diaphragm displacement curve 511 has been computed and the result displayed in box 503. The computed corresponding polynomial coefficients from order zero to order four has been displayed as BI0, BI1, BI2, BI3 and BI4, respectively. BI0 represents a normalized force factor for zero displacement of the loudspeaker diaphragm and this value is adaptively determined as discussed below. The force factor versus diaphragm displacement curve 511 exhibits a pronounced asymmetry around zero displacement (x=0) which asymmetry is caused by magnetic and mechanical construction details of the loudspeaker in question.

Figure 6:
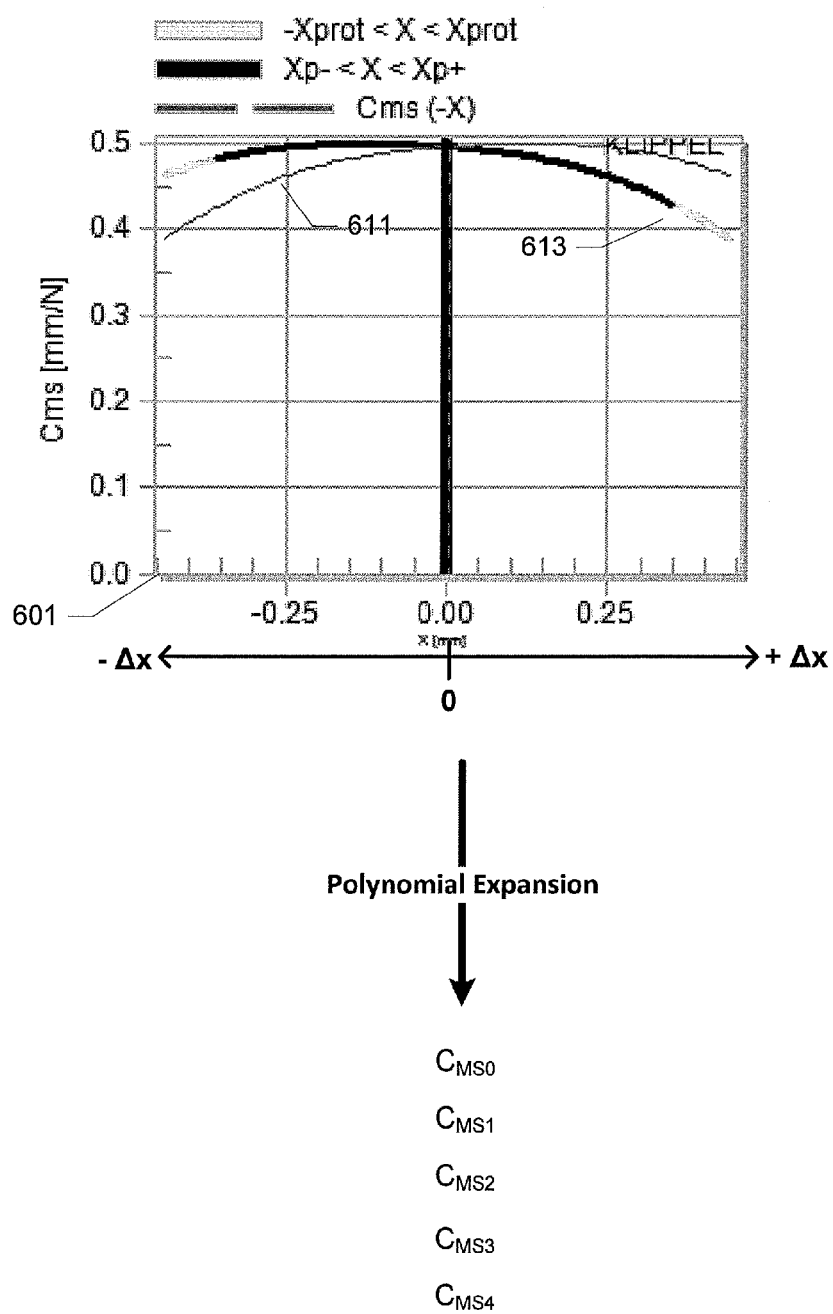
FIG. 6 is graph of an experimentally measured average non-linear behaviour of a total mechanical compliance ($C_{MS}$) versus diaphragm displacement and computed corresponding polynomial coefficients representing a polynomial curve fit between the total mechanical compliance and the diaphragm displacement.

FIG. 6 shows graph 601 depicting an experimentally measured average non-linear behaviour of a total mechanical compliance ($C_{MS}$) versus diaphragm displacement indicated by curve 611. The total mechanical compliance ($C_{MS}$) of the loudspeaker is the reciprocal quantity of the earlier discussed loudspeaker parameter total mechanical stiffness, $K_{MS}$. The average curve 601 has been obtained by a two-step procedure comprising initially measuring the individual total mechanical compliance versus diaphragm displacement characteristics for each of the above-discussed 5 representative loudspeaker samples by the KLIPPEL R&D SYSTEM for loudspeaker characterization. In a next step these individual total mechanical compliance versus diaphragm displacement characteristics were exported to the above-mentioned a proprietary software analysis program and compute the average total mechanical compliance versus diaphragm displacement as depicted on graph 601. The Y-axis of graph 601 depicts the measured average total mechanical compliance in mm/N and the X-axis depicts the diaphragm excursion or displacement x in mm in outward and inward direction. The total mechanical compliance has accordingly been measured over a range of +/−0.45 mm of diaphragm displacement. As illustrated by the curve 611, there is a significant variation of the measured total mechanical compliance, in the order of 20%, across the depicted displacement range. A polynomial curve fit to the average total mechanical compliance versus diaphragm displacement curve 611 may be computed in a similar manner to the previously described one.

Figure 7:
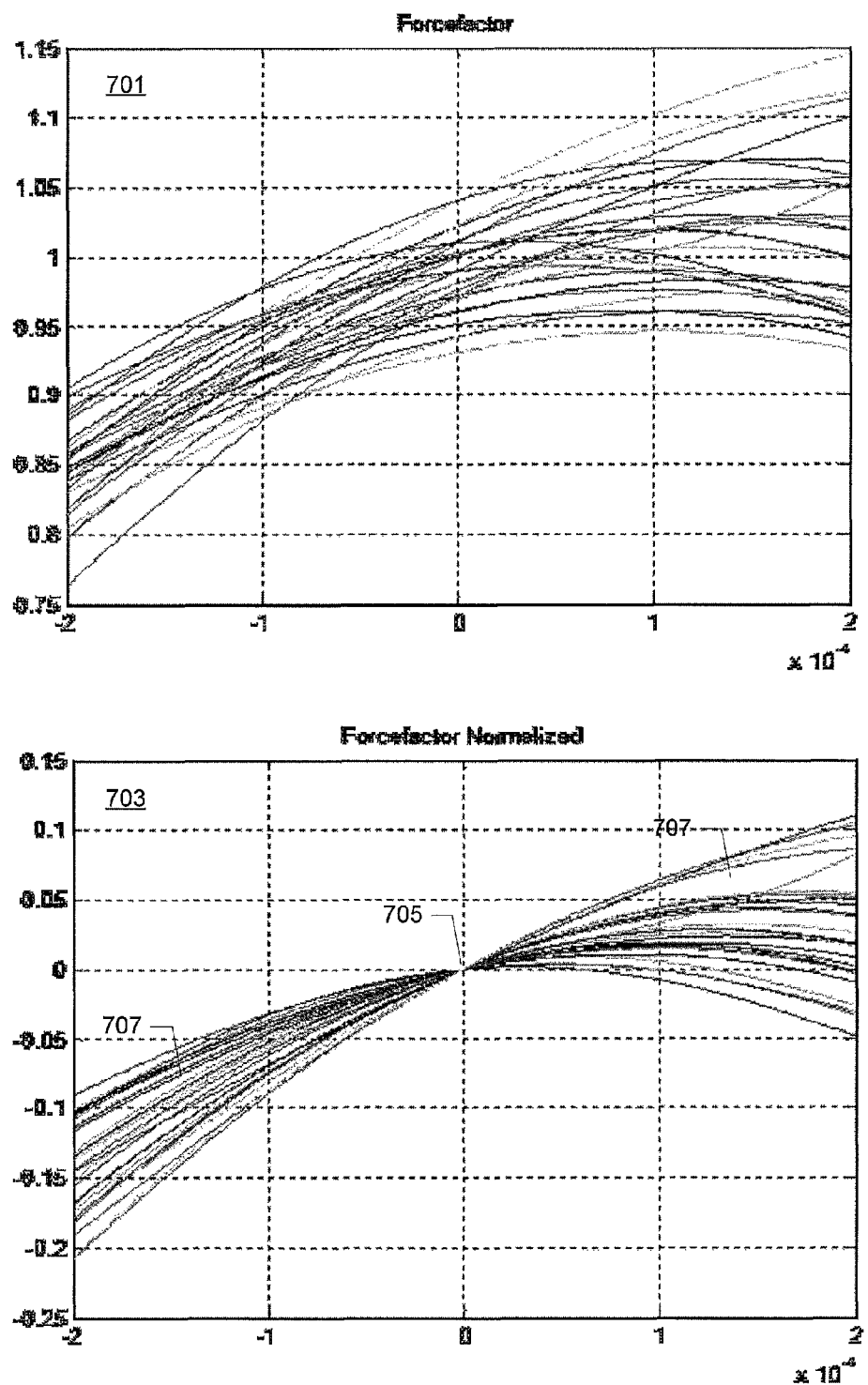
FIG. 7 shows graphs of individually measured non-linear relationships between the force factor (B*I) and diaphragm displacement for a plurality of representative electrodynamic loudspeakers in non-normalized and normalized representation.

Graph 701 of FIG. 7 shows a plurality of individually measured curves of the force factor (B*I) versus diaphragm displacement for a plurality of representative electrodynamic loudspeakers in non-normalized representation. The Y-axis depicts the measured average force factor on a dimension less relative scale and the X-axis depicts the diaphragm excursion or displacement x in mm in outward and inward direction. In this example, the number of representative electrodynamic loudspeakers is about 20, but fewer or more loudspeakers may be used as indicated by the above example using merely 5 representative electrodynamic loudspeakers to derive the desired average non-linear behaviour of the force factor. The individual force factor versus diaphragm displacement curves or characteristics were measured by the previously discussed laser displacement sensor for loudspeaker characterization. The non-linear relationship or function between the force factor and diaphragm displacement for each of the tested representative electrodynamic loudspeakers is evident from the curvature of the depicted curves on graph 701. The force factor (B*I) has accordingly been measured and recorded across a diaphragm displacement range of +/−0.20 mm. To derive or determine the desired average non-linear function between the force factor and diaphragm displacement the following steps are executed: for each of the representative loudspeakers, the plurality of force factor values versus diaphragm displacement values as graphically represented by the depicted force factor curves of graph 701 are recorded in a suitable computing device. The measured force factor curve for each of the representative loudspeakers is thereafter normalized by off-setting or dragging the force factor curve vertically, i.e. up or down along the force factor axis, to an arbitrary reference value of the diaphragm displacement (i.e. the selected loudspeaker variable in this embodiment) such as a zero diaphragm displacement as depicted on graph 703.

Figure 8:
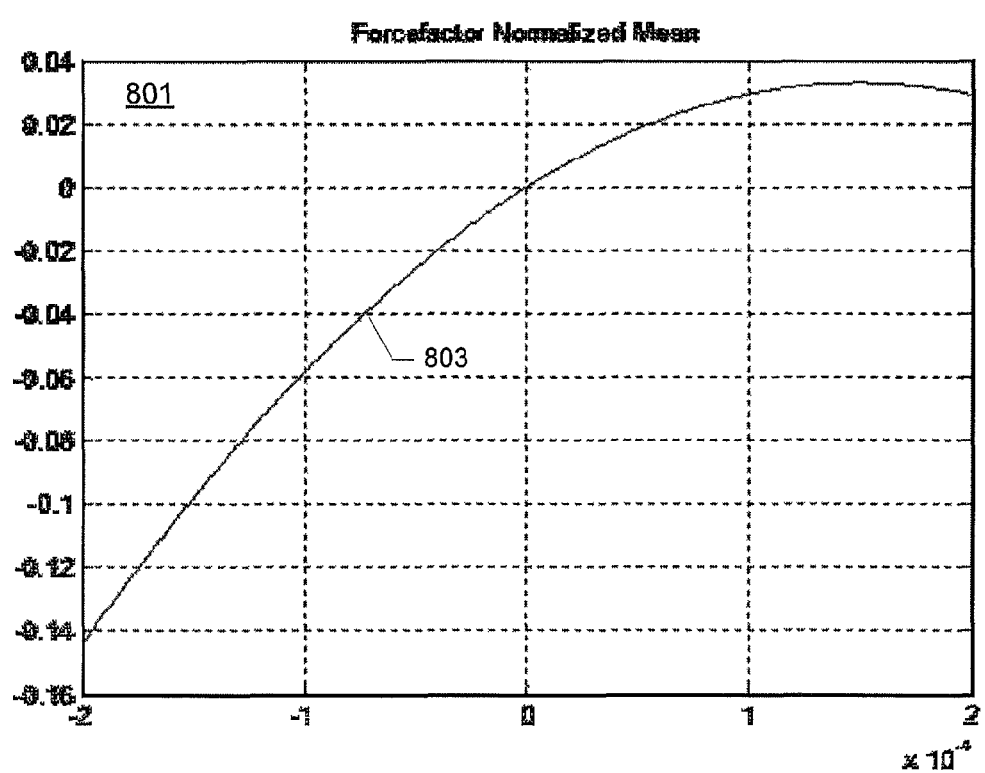
FIG. 8 shows a graph of the computed corresponding average non-linear relationship between the force factor (B*I) and diaphragm displacement in normalized representation for the plurality of representative electrodynamic loudspeakers depicted on FIG. 7.

Each of the measured force factor curves is dragged up or down, as required, until the value at zero diaphragm displacement reaches the arbitrary reference value whereby all the displaced force factor curves 707 intersect the same arbitrary force factor value at zero diaphragm displacement as indicated by reference numeral 705 of graph 703. In a subsequent step, the average value of the normalized force factor values, as represented and depicted by the force factor curves of graph 703, is computed and may be graphically represented by a single average force factor curve 803 depicted on graph 801 of FIG. 8. In the present embodiment, the average value of the normalized force factor values is computed by for each diaphragm displacement value summing the normalized force factor values of all the representative loudspeakers and dividing with the number of the representative loudspeakers, i.e. in essence computing an arithmetical mean value of the force factor. The skilled person will never the less appreciate that other computation methods may be applied to compute the average value of the normalized force factor values. In one alternative embodiment, the median value of the normalized force factor values at each diaphragm displacement value may be used to represent the average value.

A polynomial function, as discussed above in connection with FIG. 5, may finally be applied to the average normalized force factor values, as represented by curve 803 on graph 801, to represent the average non-linear relationship between the force factor and diaphragm displacement of the representative collection of loudspeakers. The corresponding polynomial coefficients may be determined by a suitable polynomial curve fit as discussed above. Hence, the adaptive value of the Bl product outputted by the linear adaptive digital loudspeaker model discussed above is applied to the determined polynomial function of the non-linear state space model to make a computation of the corresponding non-linearity compensated value of the Bl product. This non-linearity compensated value of the Bl product is utilized in the non-linear state space model to improve the accuracy of the computed diaphragm displacement x that is inputted to the audio level limiting circuit or function 204 of FIG. 2.

The normalization process made in connection with the determination of the average non-linear function is an advantage of the present methodology of estimating diaphragm excursion because it takes advantage of the adaptive nature of the linear adaptive digital model 210 of the electrodynamic loudspeaker as described in connection with FIG. 2. The linear adaptive digital model 210 computes an accurate estimate of the value of the force factor, or any other selected loudspeaker parameter, at zero diaphragm displacement over time such that the latter value remains accurate despite the previously discussed slowly varying changes over time of the value of this loudspeaker parameter. Therefore, the non-linear function can be utilized to determine the non-linearity compensated value of the Bl product by inserting the current value of the Bl product, as provided by the linear adaptive digital model, as a constant part, Bl=0, of the polynomial function 503 of FIG. 5. The desired non-linearity compensated value of the Bl product in absolute terms can be directly computed in the non-linear state-space model by using the already determined polynomial coefficients and the previous value of the diaphragm displacement x.

The invention claimed is:

1. A method of estimating an excursion of a diaphragm of a loudspeaker, comprising:
    receiving an audio input signal and generating an audio output signal based on the audio input signal;

applying the audio output signal to a coil of the loudspeaker;

detecting a coil voltage and a coil current in response to the applied audio output signal;

computing a plurality of parameters corresponding to the loudspeaker by applying information about the detected coil current and coil voltage to a linear model of the loudspeaker;

interrupting the computing the plurality of parameters based on a result of a comparison of the audio input signal with a spectral criterion; and determining the excursion of the diaphragm of the loudspeaker by applying, to a non-linear model of the loudspeaker, the audio input signal and the plurality of parameters computed using the linear model of the loudspeaker.

2. The method of claim 1, further comprising:

applying, in the non-linear model, at least one of the plurality of parameters to a function relating a loudspeaker parameter and a predetermined loudspeaker variable to compute at least one compensated parameter, wherein the function represents a relationship between the at least one of the plurality of parameters and the predetermined loudspeaker variable determined by measurements on a plurality of representative loudspeakers.

3. The method of claim 2, wherein the predetermined loudspeaker variable is the diaphragm excursion such that the function represents an excursion-dependent non-linear property of the loudspeaker.

4. The method of claim 3, wherein the plurality of parameters comprises a force factor, and the function represents a measured excursion dependence of the force factor so as to provide a compensated force factor in the non-linear model.

5. The method of claim 3, wherein the plurality of parameters comprises a total mechanical stiffness, and the function represents a measured excursion dependence of the total mechanical stiffness so as to provide a compensated mechanical stiffness in the non-linear model.

6. The method of claim 2, wherein the applying at least one of the plurality of parameters to the function comprises:

determining a present value of the at least one of the plurality of parameters received from the linear model; and computing the at least one compensated parameter as an adjustment of the present value in accordance with the function.

7. The method of claim 2, wherein the function comprises one or more polynomial coefficients representing a polynomial curve fit between the at least one of the plurality of parameters and the predetermined loudspeaker variable.

8. The method of claim 2, wherein the function comprises a look-up table mapping a plurality of values of the predetermined loudspeaker variable into values corresponding to the compensated parameter of the at least one of the plurality of parameters.

9. The method of claim 1, wherein the linear model comprises one of:

an IIR filter of second order, or of higher order, comprising a plurality of model parameters from which the plurality of parameters are derived, and an FIR filter from which the plurality of parameters are derived.

10. The method of claim 1, wherein the linear model comprises at least one fixed parameter such as a total moving mass of the loudspeaker.

11. The method of claim 1, wherein at least one of the plurality of parameters can be selected from a group consisting of a force factor, a total mechanical stiffness, a resistance of the coil, a total mechanical damping factor, a total moving mass, and an inductance of the coil.

12. The method of claim 1, further comprising:

sampling and digitizing the current to generate a digital current signal at a first sampling frequency, and sampling and digitizing the voltage to generate a digital voltage signal at the first sampling frequency.

13. The method of claim 12, further comprising one of:

receiving the audio input signal as a digital audio input at a second sampling frequency; and receiving, sampling, and digitizing the audio input signal to produce the digital audio input signal at the second sampling frequency.

14. The method of claim 13, wherein the first sampling frequency is lower than the second sampling frequency.

15. The method of claim 12, prior to applying the digital current signal and the digital voltage signal to the linear model, further comprising:

lowpass filtering the digital current signal and the digital voltage signal; and down-sampling each of the digital current signal and the digital voltage signal from the first sampling frequency to another sampling frequency.

16. The method of claim 1, further comprising:

limiting the excursion of the diaphragm by comparing an instantaneous excursion of the diaphragm with a limit criterion.

17. The method of claim 16, wherein the limit criterion is a maximum displacement.

18. The method of claim 16, wherein the limiting the excursion of the diaphragm comprises attenuating a level of the audio output signal in a sub-band or a broad-band of the audio output signal.

19. The method of claim 18, comprising, prior to the comparison, delaying the audio input signal.

20. A sound reproduction assembly for a loudspeaker, comprising:

an input for receiving an audio input signal supplied by a source;

an amplifier configured to receive the audio input signal and generate a corresponding audio output signal as a voltage at a pair of output terminals connectable to a coil of the loudspeaker;

a detector configured to detect the voltage and a current flowing into the coil in response to the application of the voltage; and a processor configured to:

apply the detected current and the detected voltage to a linear model of the loudspeaker to compute a plurality of parameters, interrupt the computing the plurality of parameters based on a result of a comparison of the audio input signal with a spectral criterion, and apply the plurality of parameters to a non-linear model of the loudspeaker to determine an excursion of a diaphragm of the loudspeaker.

21. The sound reproduction assembly of claim 20, wherein the processor is further configured to limit the excursion of the diaphragm by comparing the diaphragm excursion with a limit criterion.

22. The sound reproduction assembly of claim 20, wherein the detector comprises a converter configured to sample and digitize the current to supply a digital current signal.

23. The sound reproduction assembly of claim 20, wherein the detector comprises a converter configured to sample and digitize the voltage to generate a digital voltage signal.

24. The sound reproduction assembly of claim 20, wherein the processor comprises a microprocessor controllable by an application program comprising a set of executable program instructions stored in a program memory.

25. The sound reproduction assembly of claim 24, wherein the set of executable program instructions computes, when executed, the plurality of parameters.

26. The sound reproduction assembly of claim 20, comprising a non-volatile memory address space storing a look-up table mapping loudspeaker variable values into values corresponding to compensated parameters of the plurality of parameters.

27. The sound reproduction assembly of claim 20, wherein the amplifier comprises a class D power stage configured to supply a pulse modulated voltage to the loudspeaker.

28. The sound reproduction assembly of claim 20 integrated upon a semiconductor substrate.

29. The sound reproduction assembly of claim 20 in combination with a sound reproduction system, the system comprising:
   a loudspeaker comprising a movable diaphragm assembly for generating audible sound in response to actuation of the diaphragm assembly; and
   a source coupled to the input of the sound reproduction assembly,
   wherein the sound reproduction assembly is electrically coupled to the movable diaphragm assembly.

30. The sound reproduction system of claim 29 in combination with a portable communication device.

* * * * *